United States Patent
Liou et al.

(10) Patent No.: US 8,853,858 B2
(45) Date of Patent: *Oct. 7, 2014

(54) CURING LOW-K DIELECTRICS FOR IMPROVING MECHANICAL STRENGTH

(75) Inventors: Joung-Wei Liou, Zhudong (TW);
Keng-Chu Lin, Ping-Tung (TW);
Shwang-Ming Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/571,276

(22) Filed: Aug. 9, 2012

(65) Prior Publication Data
US 2012/0306098 A1   Dec. 6, 2012

Related U.S. Application Data

(63) Continuation of application No. 12/060,999, filed on Apr. 2, 2008, now Pat. No. 8,258,629.

(51) Int. Cl.
  *H01L 23/48* (2006.01)
  *H01L 23/00* (2006.01)
  *H01L 21/31* (2006.01)
  *H01L 23/532* (2006.01)
  *H01L 21/02* (2006.01)
  *H01L 23/522* (2006.01)
  *H01L 21/768* (2006.01)

(52) U.S. Cl.
  CPC ..... *H01L 23/522* (2013.01); *H01L 2924/30105* (2013.01); *H01L 24/05* (2013.01); *H01L 2924/01029* (2013.01); *H01L 21/31* (2013.01); *H01L 2924/01014* (2013.01); *H01L 23/53295* (2013.01); *H01L 2224/04042* (2013.01); *H01L 2924/01033* (2013.01); *H01L 2924/01019* (2013.01); *H01L 2924/19043* (2013.01); *H01L 21/02348* (2013.01); *H01L 2924/01023* (2013.01); *H01L 2924/01032* (2013.01); *H01L 2924/14* (2013.01); *H01L 2924/01005* (2013.01); *H01L 2224/05* (2013.01); *H01L 2924/01006* (2013.01); *H01L 23/562* (2013.01); *H01L 2924/19041* (2013.01); *H01L 21/76825* (2013.01)

USPC ..... 257/758; 257/620; 257/759; 257/E21.575

(58) Field of Classification Search
USPC ............. 257/758, 759, 620, E21.575
See application file for complete search history.

(56) References Cited

U.S. PATENT DOCUMENTS

| | | | |
|---|---|---|---|
| 6,198,170 B1 * | 3/2001 | Zhao | 257/784 |
| 6,313,024 B1 * | 11/2001 | Cave et al. | 438/598 |
| 6,495,917 B1 | 12/2002 | Ellis-Monaghan et al. | |
| 6,864,583 B2 | 3/2005 | Matsunaga et al. | |
| 7,193,289 B2 | 3/2007 | Adkisson et al. | |
| 7,439,154 B2 | 10/2008 | Hsu et al. | |

(Continued)

FOREIGN PATENT DOCUMENTS

CN   1505140 A   6/2004

*Primary Examiner* — Julia Slutsker
(74) *Attorney, Agent, or Firm* — Slater and Matsil, L.L.P.

(57) ABSTRACT

An integrated circuit structure including reflective metal pads is provided. The integrated circuit structure includes a semiconductor substrate; a first low-k dielectric layer overlying the semiconductor substrate, wherein the first low-k dielectric layer is a top low-k dielectric layer; a second low-k dielectric layer immediately underlying the first low-k dielectric layer; and a reflective metal pad in the second low-k dielectric layer.

22 Claims, 10 Drawing Sheets

(56) References Cited

U.S. PATENT DOCUMENTS

| | | | |
|---|---|---|---|
| 7,994,069 B2* | 8/2011 | Smith et al. | 438/778 |
| 2005/0245096 A1 | 11/2005 | Gates et al. | |
| 2006/0154469 A1* | 7/2006 | Hess et al. | 438/618 |
| 2006/0163699 A1 | 7/2006 | Kumakawa et al. | |
| 2007/0080464 A1* | 4/2007 | Goebel et al. | 257/774 |
| 2007/0085210 A1 | 4/2007 | Hsu et al. | |
| 2007/0222037 A1 | 9/2007 | Wu | |
| 2008/0099884 A1 | 5/2008 | Inohara | |
| 2008/0122039 A1 | 5/2008 | Liu | |
| 2008/0197513 A1 | 8/2008 | Restaino et al. | |
| 2009/0121337 A1 | 5/2009 | Abe et al. | |

* cited by examiner

CURING LOW-K DIELECTRICS FOR IMPROVING MECHANICAL STRENGTH

This application is a continuation of U.S. patent application Ser. No. 12/060,999, filed on Apr. 2, 2008, entitled "Curing Low-K Dielectrics for Improving Mechanical Strength," which application is hereby incorporated herein by reference in its entirety.

TECHNICAL FIELD

This invention relates generally to integrated circuits, specifically to the back-end-of-the-line process, and more specifically to improving mechanical strength of low-k dielectric materials using ultra-violet (UV) curing.

BACKGROUND

As the semiconductor industry introduces new generations of integrated circuits (IC's) having higher performance and greater functionality, the density of the elements that form those IC's is increased, while the dimensions, sizes, and spacing between the individual components or elements are reduced. While in the past such reductions were limited only by the ability to define the structures photo-lithographically, device geometries having smaller dimensions created new limiting factors. For example, for any two adjacent conductive paths, as the distance between the conductors decreases, the resulting capacitance (a function of the dielectric constant (k) of the insulating material divided by the distance between conductive paths) increases. This increased capacitance results in increased capacitive coupling between the conductors, increased power consumption, and increased resistive-capacitive (RC) delay. Therefore, the continual improvement in the performance and functionality of semiconductor IC's depend upon developing dielectric materials having lower dielectric constants (k) than that of the most commonly used silicon oxide, thus resulting in reduced capacitance.

Low-k dielectric materials typically require a curing process subsequent to the deposition in order to increase their porosities, lower their k values, and improve their mechanical strengths. Typical curing methods include thermal curing, plasma curing, and ultra violet (UV) curing. Among the three methods, plasma and UV curing are performed at substantially shorter times or at lower temperatures, eliminating the need for prior furnace curing, and hence reducing the total thermal budget.

Porous films are mechanically weak by nature. Weak films may fail in the chemical mechanical polishing (CMP) processes employed to planarize the wafer surface during chip manufacturing. Further, the weak low-k dielectric materials cause difficulties in the packaging processes. For example, when wafers are sawed, the low-k dielectric materials in scribe lines may peel off. In addition, in wire bonding processes, the force applied for detaching wires also causes the low-k dielectric materials underlying the bond pads to peel off. Both situations may cause circuit failure. Accordingly, performing an efficient curing to maximize the mechanical strength of low-k dielectric materials becomes very important.

FIG. 1 schematically illustrates a cross-sectional view of an integrated circuit structure in a curing stage, in which extreme low-k (ELK) layer 2, etch stop layer 4, and ELK layer 6 are shown. After ELK layer 6 is deposited, it is cured using a UV curing with a UV light, as is symbolized by arrow 8. To efficiently cure ELK 6, it is desirable that the UV energy is absorbed by ELK 6 as much as possible. However, a significant portion of UV energy penetrates through ELK 6, and goes into etch stop layer 4 and the underlying integrated circuits, including ELK 2. The efficiency of the UV curing is thus low. A new method for forming and curing low-k dielectric materials is thus needed.

SUMMARY OF THE INVENTION

In accordance with one aspect of the present invention, an integrated circuit structure includes a bond pad formed in a top dielectric layer over a substrate, a first metallization layer formed under the top dielectric layer, a first reflective metal pad formed in a second metallization layer, wherein the second metallization layer is formed under the first metallization layer and wherein the first reflective metal pad vertically overlaps the bond pad and a second reflective metal pad formed in a third metallization layer, wherein the third metallization layer is formed under the second metallization layer, and wherein the second reflective metal pad vertically overlaps the bond pad.

In accordance with another aspect of the present invention, an integrated circuit device includes a plurality of integrated circuits formed in a substrate, a plurality of inter metal dielectric layers formed over the substrate, wherein a bond pad is formed in a top inter metal dielectric layer and a first reflective metal pad formed underneath the bond pad, wherein the first reflective metal pad is vertically aligned with the bonding pad and the first reflective metal pad is of a size similar to a size of the bond pad.

In accordance with yet another aspect of the present invention, a method comprises providing a substrate comprising a plurality of integrated circuits, depositing a first dielectric layer over the substrate, forming a first reflective metal pad in the first dielectric layer, wherein a top surface of the first reflective metal pad is coplanar with a top surface of the first dielectric layer, applying a first curing process to the first dielectric layer and forming a bond pad over the first dielectric layer, wherein the bond pad is vertically aligned with the first reflective metal pad and the bond pad is of a size similar to a size of the first reflective metal pad.

The advantageous feature of the present invention includes improved mechanical strength of interconnect structures. No additional masks and processes are needed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel integrated circuit structure including patterns for reflecting ultra-violet (UV) light and methods of forming the same are provided. Throughout the various views and illustrative embodiments of the present invention, like reference numbers are used to designate like elements.

Figure 1:
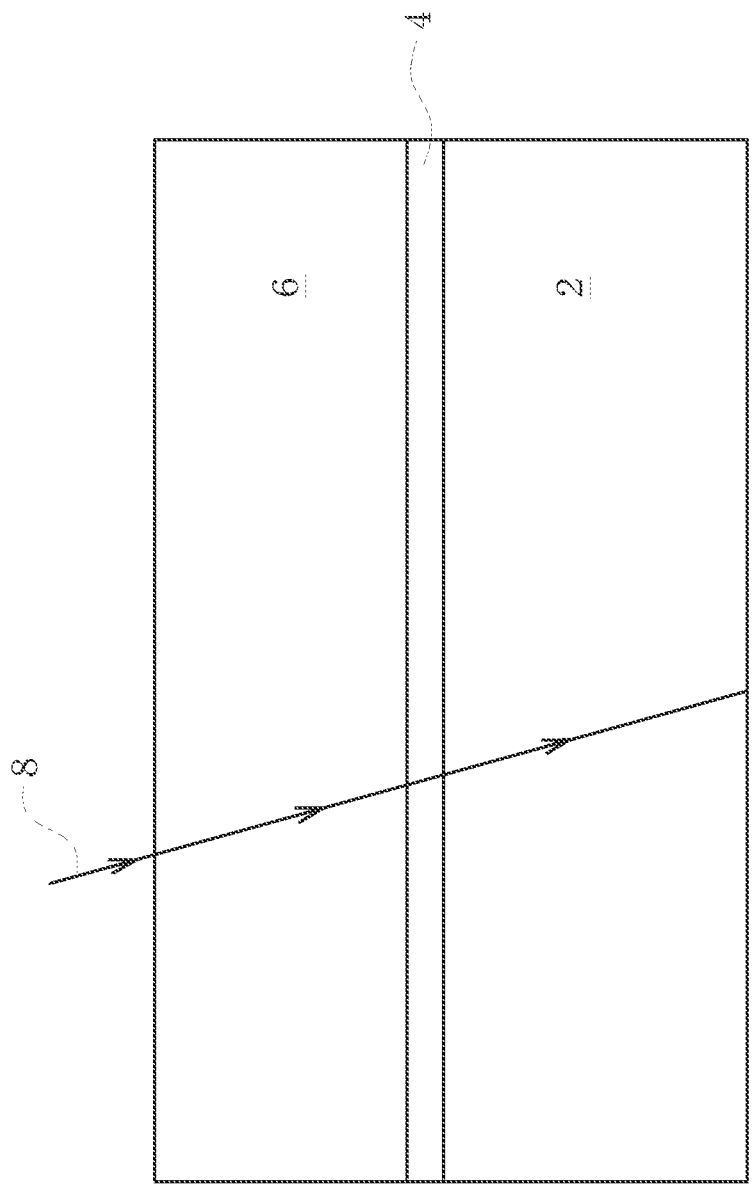
FIG. 1 illustrates a cross-sectional view of a low-k dielectric layer in a curing stage.
Figure 2:
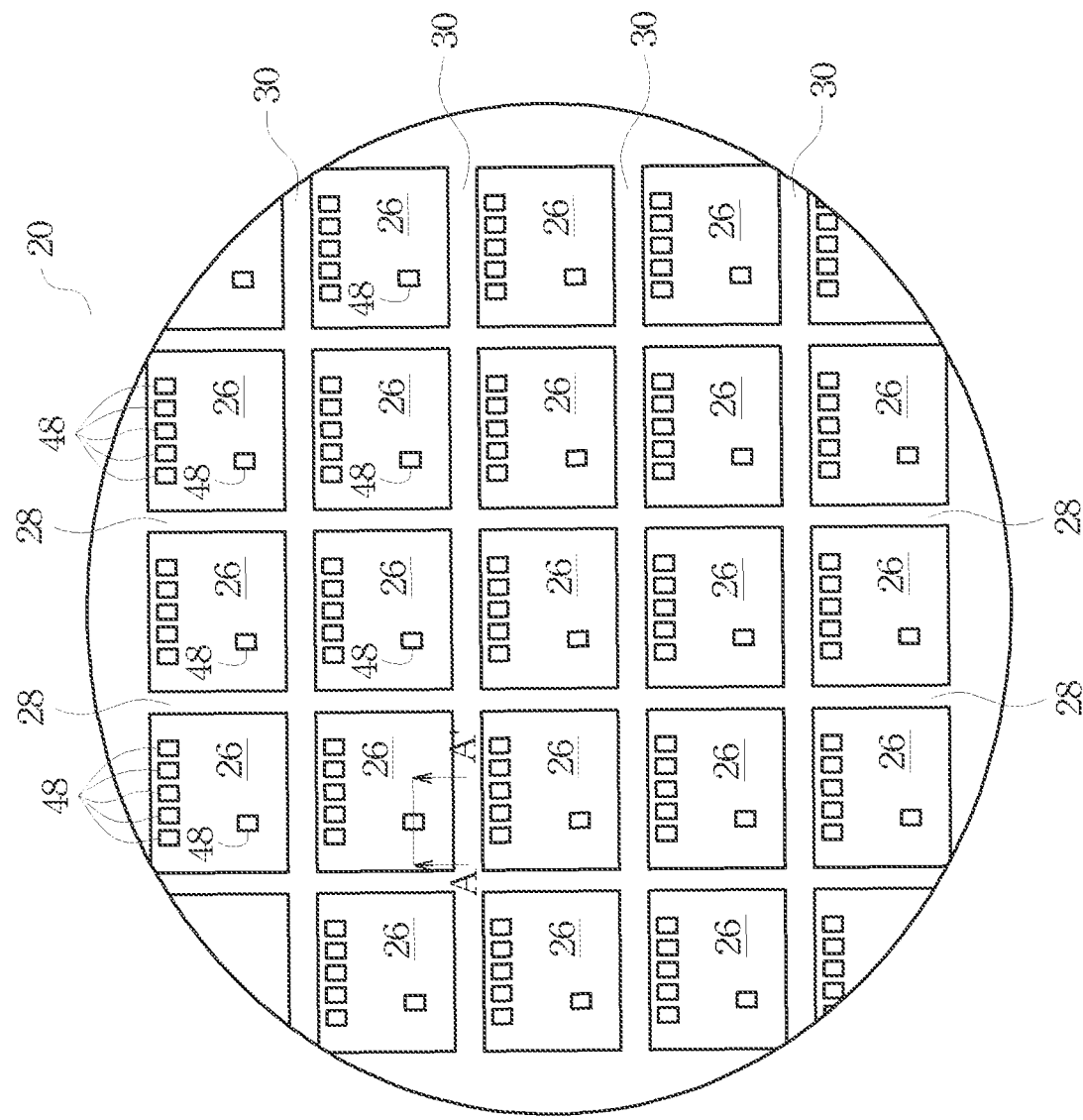
FIG. 2 illustrates a top view of a semiconductor wafer.

Referring to FIG. 2, a top view of semiconductor wafer 20 is shown. Semiconductor wafer 20 includes semiconductor chips (also commonly referred to as dies) 26 separated from each other by first scribe lines 28 and second scribe lines 30. The first scribe lines 28 extend in a first direction and the second scribe lines 30 extend in a second direction perpendicular to the first direction. Bond pads 48 are formed on the surfaces of semiconductor chips 26.

Figure 3:
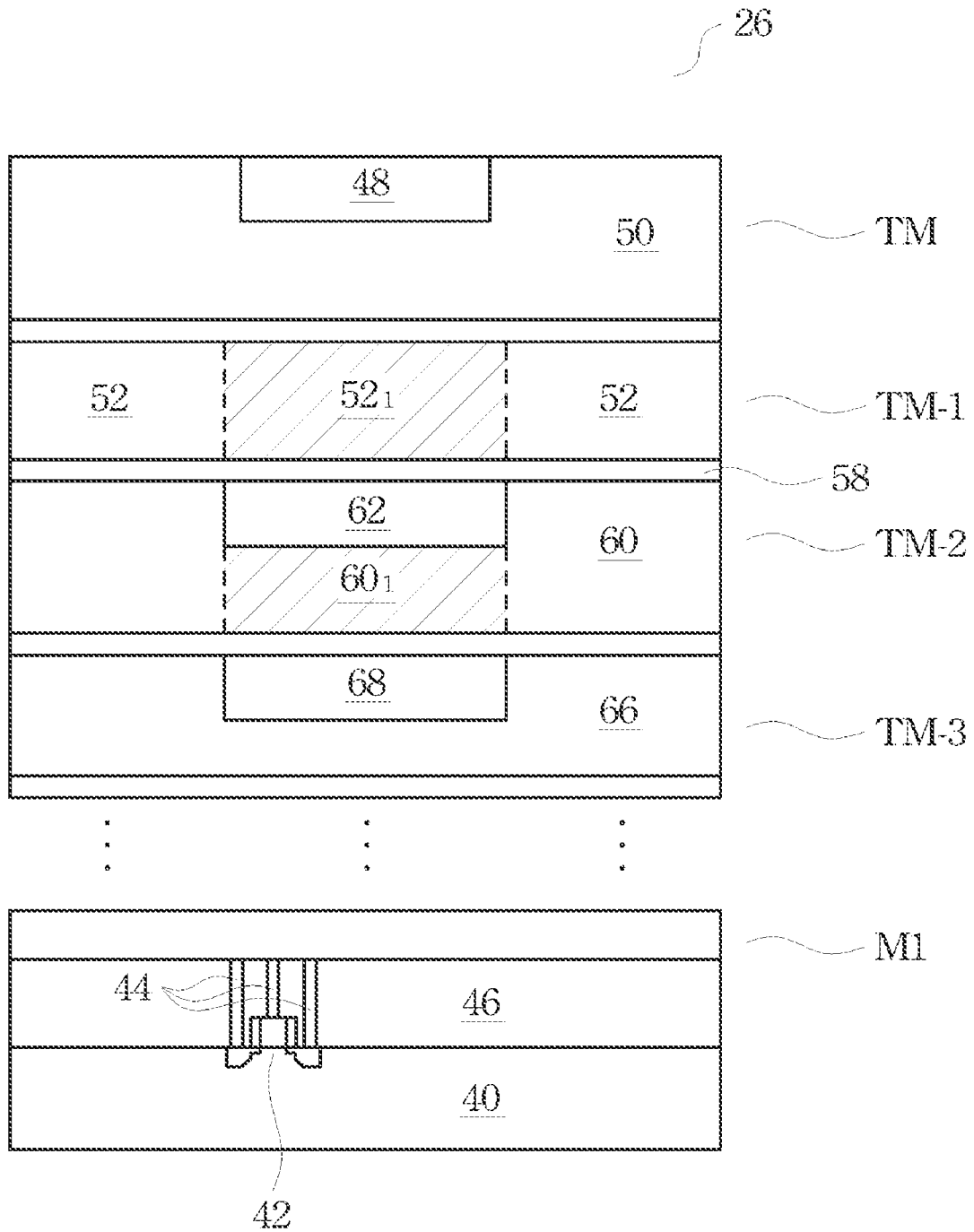
FIGS. 3 and 4 are cross-sectional views of an embodiment of the present invention, wherein reflective metal pads are formed under a bond pad.

FIG. 3 illustrates a cross-sectional view of a portion of the integrated circuit structure shown in FIG. 2, wherein the cross-sectional view is taken along a plane crossing line A-A' in FIG. 2. The top view of the corresponding portion in FIG. 2 is magnified and shown in FIG. 5, which illustrates a portion of one of the semiconductor chips 26.

Referring to FIG. 3, semiconductor substrate 40 is preferably formed of silicon, although it may also be formed of other group III, group IV, and/or group V elements, such as silicon, germanium, gallium, arsenic, and combinations thereof. Semiconductor substrate 40 may also be in the form of bulk substrate or silicon-on-insulator (SOI) substrate. Integrated circuit devices such as transistors, capacitors, resistors, and the like, are formed at the top surface of semiconductor substrate 40. Transistor 42 is illustrated to symbolize the integrated circuit devices.

Metal lines are used to interconnect the integrated circuit devices. Metal lines may be formed in different layers and separated by inter-layer dielectrics (ILD) and inter-metal dielectrics (IMD). Semiconductor chip 26 may include up to eight metallization layers, or even more. Throughout the description, the dielectric layer in which contact plugs 44 are formed is referred to as ILD 46, and the dielectric layers over ILD 46 are referred to as IMDs. The metallization layer immediately over ILD 46 is referred to as the bottom metallization layer (M1), and the metallization layer in which bond pads are formed is referred to as the top metallization layer (TM). Accordingly, from top to bottom, the metallization layers are referred to as TM, TM-1, TM-2, TM-3 . . . and M1.

Bond pad 48 is on the top surface of semiconductor chip 26, and is exposed through passivation layer 50. Bond pad 48 and passivation layer 50 are in combination referred to as the top metallization layer TM. Passivation layer 50 preferably comprises dielectric materials such as un-doped silicate glass (USG), oxides, nitrides, or the like, and preferably has a k value greater than that of the underlying low-k dielectric layers. In an exemplary embodiment, passivation layer 50 has a k value of greater than about 3.0. Bond pad 48 is electrically connected to other portions of the integrated circuit through metal lines, vias, and redistribution traces (not shown).

Figure 4:
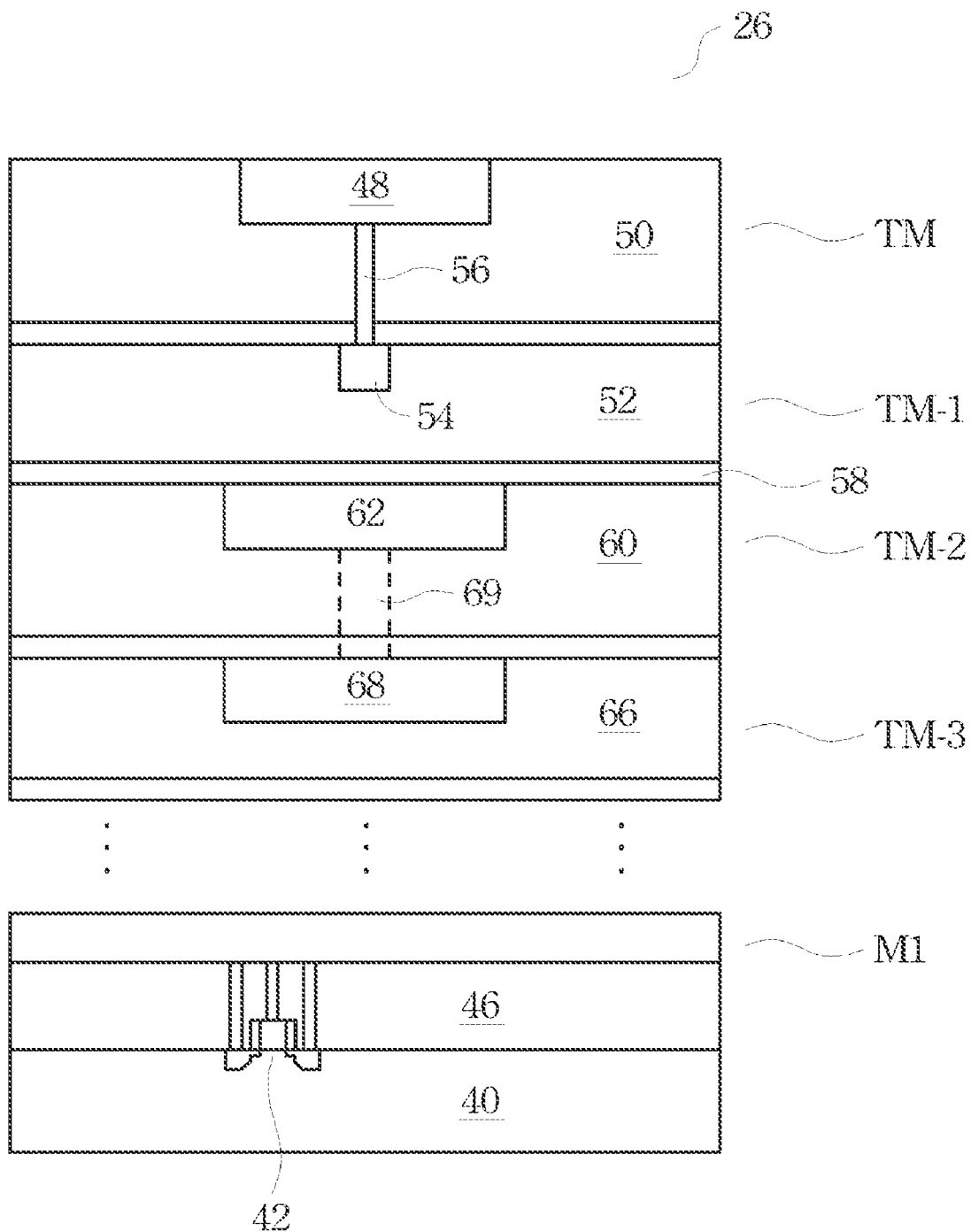

Metallization layer TM-1 is formed underlying the top metallization layer TM. Metallization layer TM-1 includes low-k dielectric layer 52, and hence is the top layer including low-k dielectric materials. Accordingly, low-k dielectric layer 52 is referred to as the top low-k dielectric layer. Preferably, low-k dielectric layer 52 has a k value of less than about 3.9, and more preferably less than about 2.5, and hence may be an extreme low-k dielectric (ELK) layer. Exemplary materials of low-k dielectric layer 52 include fluorinated silicate glass (FSG), carbon-containing dielectric materials, and the like, which may further contain nitrogen, hydrogen, oxygen, and combinations thereof. In an embodiment as is shown in FIG. 3, no metal features, such as copper lines and vias are formed directly underlying bond pad 48 and in top low-k dielectric layer 52. However, metal lines (not shown) will be formed in top low-k dielectric layer 52 in regions not directly underlying bond pad 48. In alternative embodiments, as is shown in FIG. 4, metal line 54 may be formed in top low-k dielectric layer 52, and is connected to bond pad 48 through via 56.

Optionally, semiconductor chip 26 may include an additional passivation layer (not shown) between passivation layer 50 and top low-k dielectric layer 52. The additional passivation layer may be formed of essentially the same material as passivation layer 50.

Figure 5:
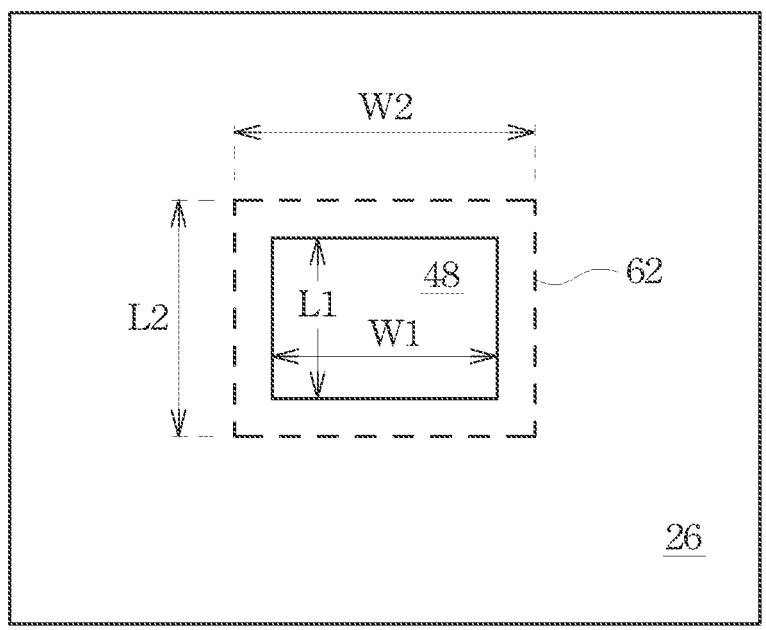
FIG. 5 illustrates a top view of the structures shown in FIGS. 3 and 4.

Referring back to FIG. 3, metallization layer TM-2 is formed underlying metallization layer TM-1. Metallization layer TM-2 also includes low-k dielectric layer 60, which may be formed of essentially the same material (or selected from a same group of materials) as low-k dielectric layer 52. Etch stop layer 58 may be formed between metallization layers TM-1 and TM-2. In the preferred embodiment, metal pad 62 is formed in metallization layer TM-2, and substantially vertically overlapping bond pad 48. Throughout the description, metal pad 62 (and other similar metal pads such as metal pad 68) is referred to as reflective metal pad for its function of reflecting UV light, as will be described in detailed in subsequent paragraphs. The reflective metal pad 62 advantageously reflects the UV light used for curing the overlying low-k dielectric layer 52, so that the UV light no longer penetrates into the underlying dielectric materials. The hardening of the portion of low-k dielectric layer $52_1$, which is directly over reflective metal pad 62, is thus improved. Since the low-k dielectric materials under bond pad 48 are most likely to be damaged in wire-bonding processes, these portions need to have greater mechanical strength. Accordingly, as shown in FIG. 5, to harden these portions more effectively, the length L2 and the width W2 of reflective metal pad 62 are at least substantially close to the respective length L1 and the width W1 of bond pad 48. In an exemplary embodiment, length L2 is greater than about 80 percent of length L1, and/or width W2 is greater than about 80 percent of width W1. More preferably, length L2 is greater than about L1, and width W2 is greater than about W1. Even more preferably, reflective metal pad 62 not only fully vertically overlaps bond pad 48, but also extends beyond edges of bond pad 48 in, at least one, preferably all directions (refer to FIG. 5).

The structure in metallization layer TM-2 may be repeated throughout metallization layers TM-3 through M1. In the embodiment shown in FIG. 3, metallization layer TM-3 includes low-k dielectric layer 66 and reflective metal pad 68. Low-k dielectric layer 66 and the underlying low-k dielectric materials may be formed using essentially the same materials (or selected from the same group of materials) as in low-k dielectric materials 52 and/or 60. The forming of reflective metal pad 68 improves the curing of the direct overlying portion $60_1$ of dielectric layer 60. Similar to reflective metal pad 62, reflective metal pad 68 and each of the underlying reflective metal pads (not shown) may have a size substantially close to, or greater than, the size of bond pad 48, and are preferably vertically aligned to bond pad 48.

In an embodiment, reflective metal pads 62, 68, and the underlying reflective metal pads are preferably disconnected from each other, and are electrically floating. In alternative embodiments, reflective metal pads 62, 68, and the underlying reflective metal pads may be interconnected. FIG. 4 illustrates exemplary via 69 for connecting reflective metal pads 62 and 68. However, in this case, the interconnected reflective metal pads are also preferably floating. It is noted that reflective metal pads 62 and 68 are different from conventional dummy patterns. The conventional dummy patterns, due to their function for achieving uniform pattern densities, are typically small, for example, with length/width less than several micrometers. The length/width of reflective metal pads 62 and 68, however, are substantially close to that of bond pad 48, and may be tens of micro meters, or even a hundred micro meters or greater. Correspondingly, the regions including the reflective metal pads will have a higher pattern density than surrounding regions.

Preferably, the reflective metal pads are formed under substantially all bond pads of semiconductor chip 26. For each of the bond pads of semiconductor chip 26, the reflective metal pads may be formed throughout metallization layers M1 through TM-2. Alternatively, only upper metallization layers (for example, metallization layers TM-2 and/or TM-3) include reflective metal pads, while the lower metallization layers do not have the reflective metal pads. This is partially due to the fact that the low-k dielectric materials in upper metallization layers are more prone to the damage caused by wire bonding.

Figure 6A:
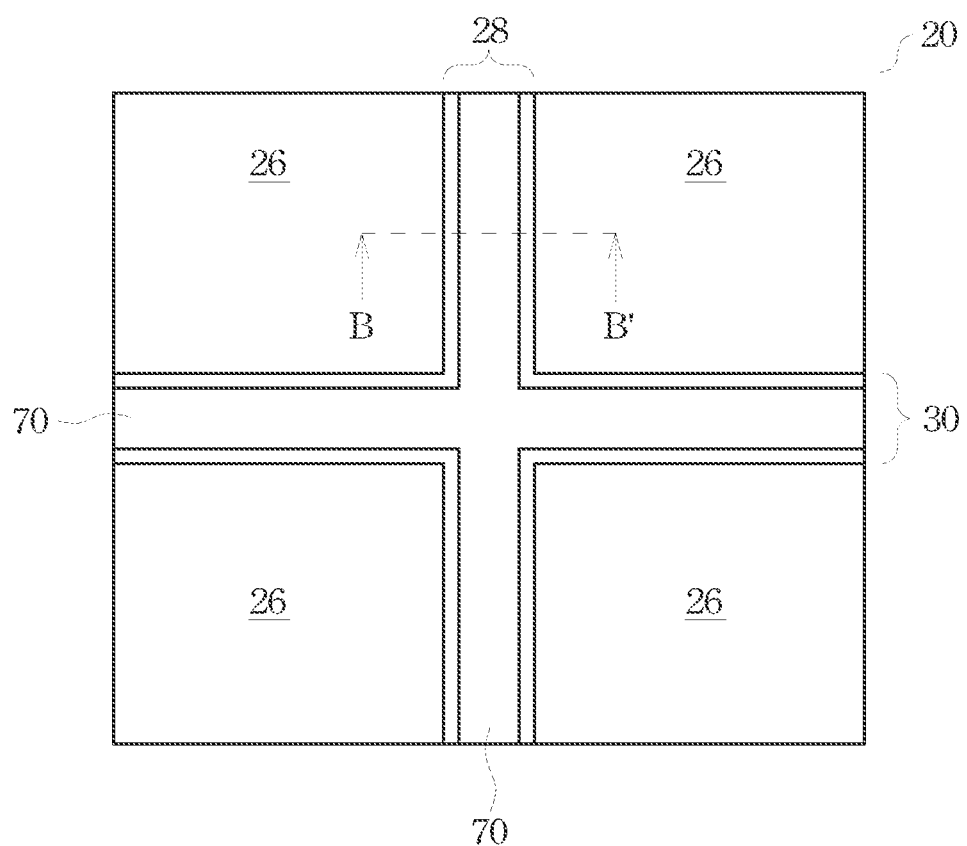
FIGS. 6A and 6B are cross-sectional views of an alternative embodiment of the present invention, wherein reflective metal pads are formed inside scribe lines.
Figure 6B:
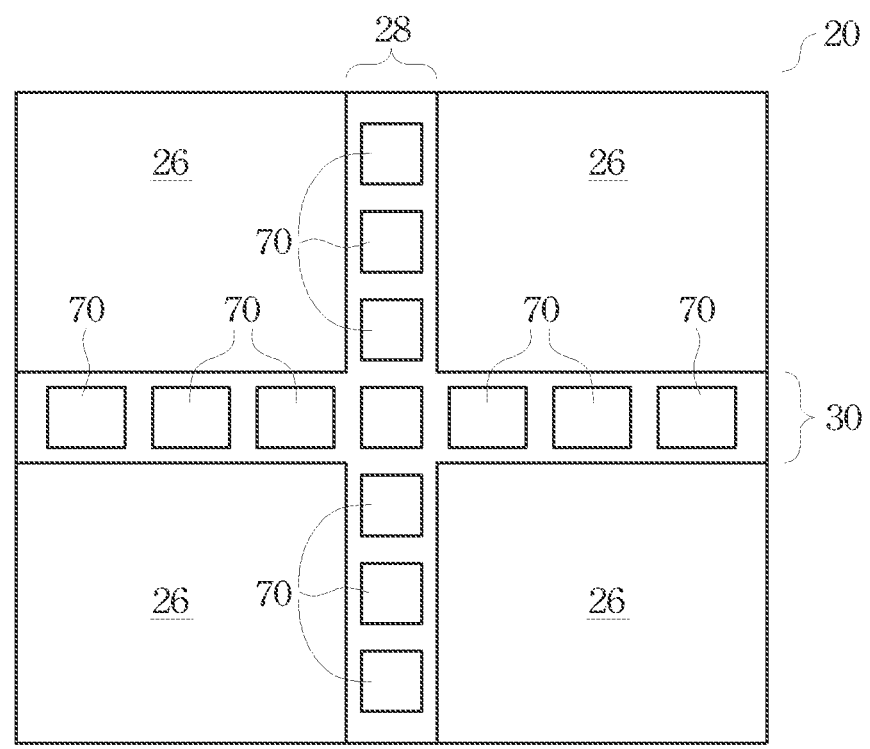
Figure 7:
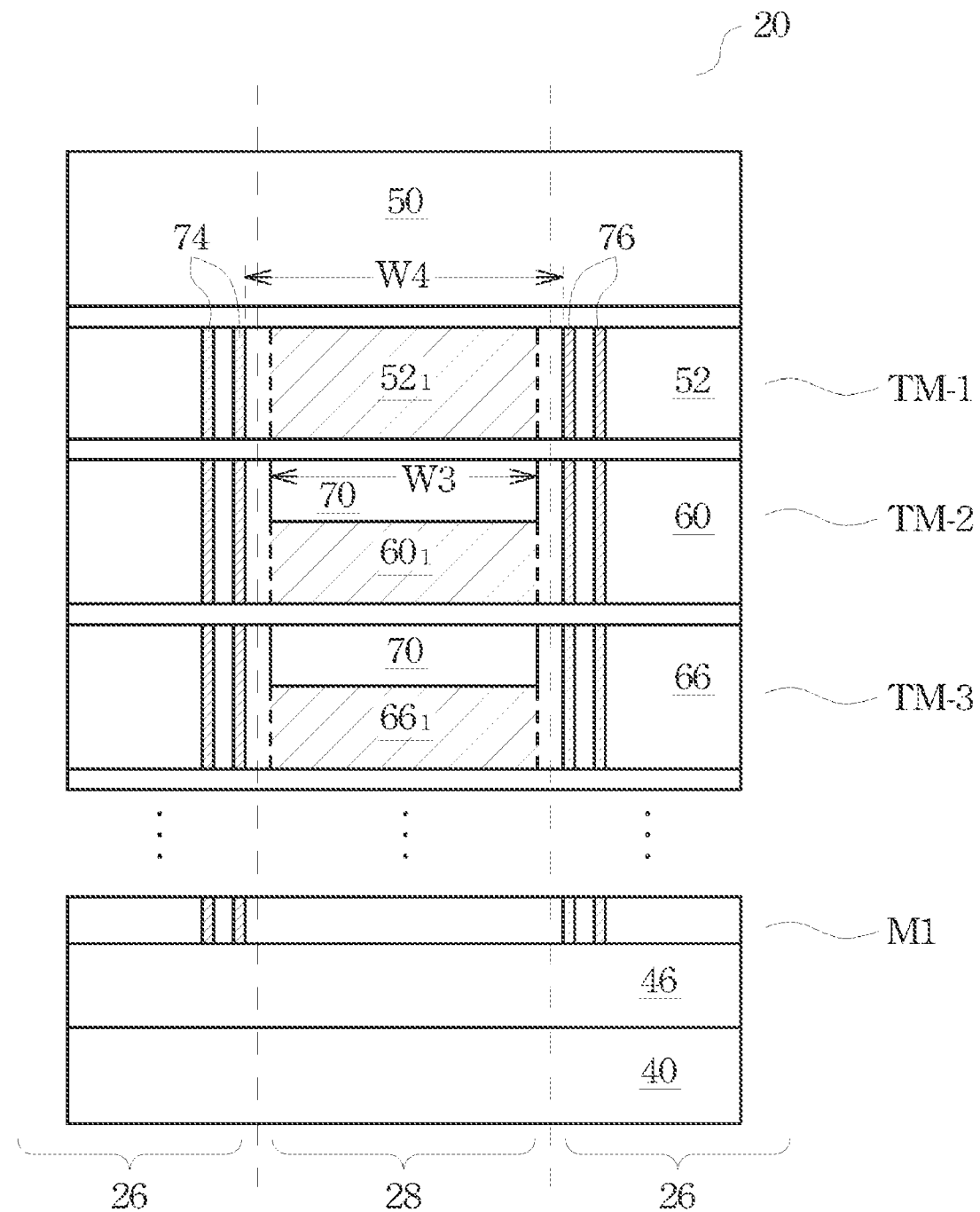
FIG. 7 is a cross-sectional view of the structures shown in FIGS. 6A and 6B.

FIGS. 6A through 7 illustrate an alternative embodiment of the present invention, wherein the reflective metal pads are formed in scribe lines. FIG. 6A illustrates a top view of a portion of wafer 20 (refer to FIG. 2). In an embodiment, reflective metal pads 70 are formed as metal lines, and may extend from one end of wafer 20 to the other. In alternative embodiments, as shown in FIG. 6B, reflective metal pads 70 are formed as rectangles, and are arranged as lines inside scribe lines 28 and 30. Again, the lines formed of reflective metal pads 70 may extend from one end of wafer 20 to the other.

FIG. 7 illustrates a cross-sectional view of the structure shown in FIG. 6A, wherein the cross-sectional view is taken along a plane crossing line B-B' in FIG. 6A. Seal rings 74 belong to the semiconductor chip 26 on the left side, while seal rings 76 belong to the semiconductor chip 26 on the right side. Similar to the embodiment shown in FIG. 3, reflective metal pads/lines 70 are preferably formed in metallization layers TM-2, TM-3 . . . and M1. As a result, the low-k dielectric portions $52_1$, $60_1$, and $66_1$, which are directly overlying the reflective metal pads/lines 70, are hardened more effectively, and have improved mechanical strength. When wafer 20 is sawed along scribe lines 28 and 30, the hardened low-k dielectric portions $52_1$, $60_1$, and $66_1$ are less likely to peel off due to the improved mechanical strength.

Figure 8:
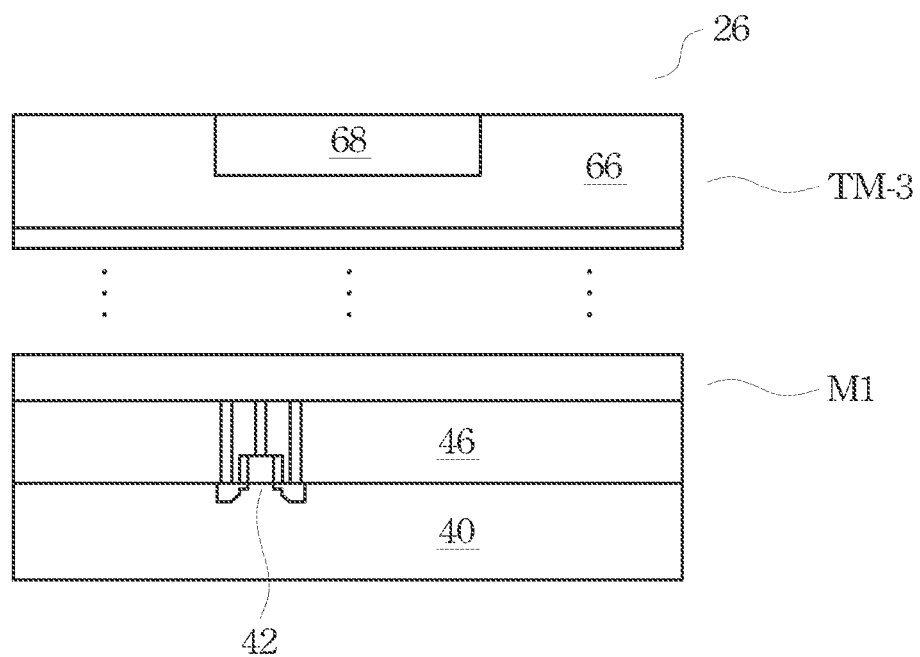
FIGS. 8 through 10 are cross-sectional views of intermediate stages in the manufacturing of the embodiment shown in FIG. 3.
Figure 9:
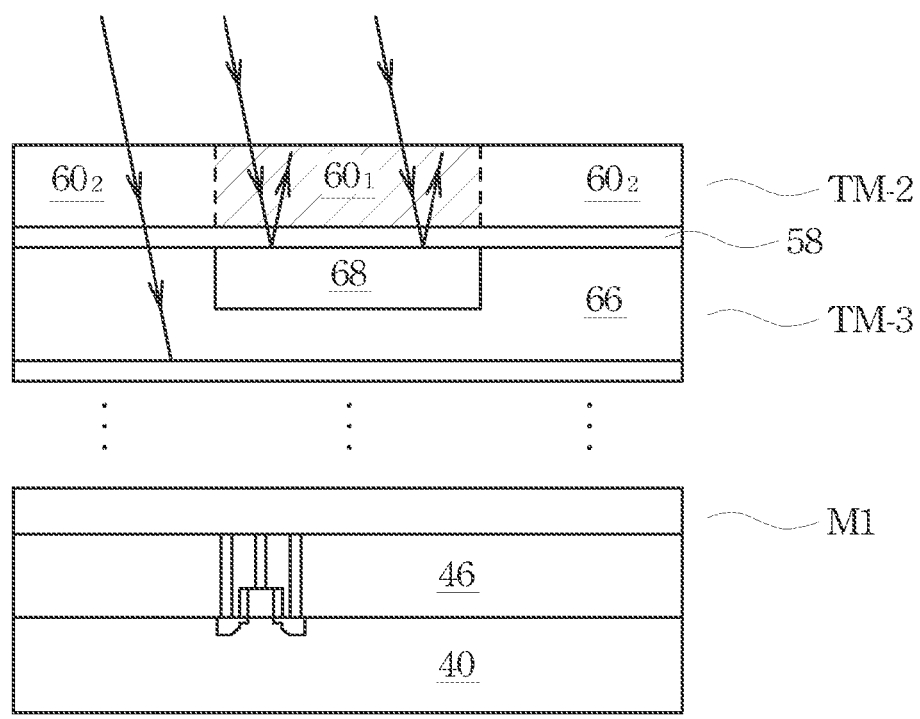
Figure 10:
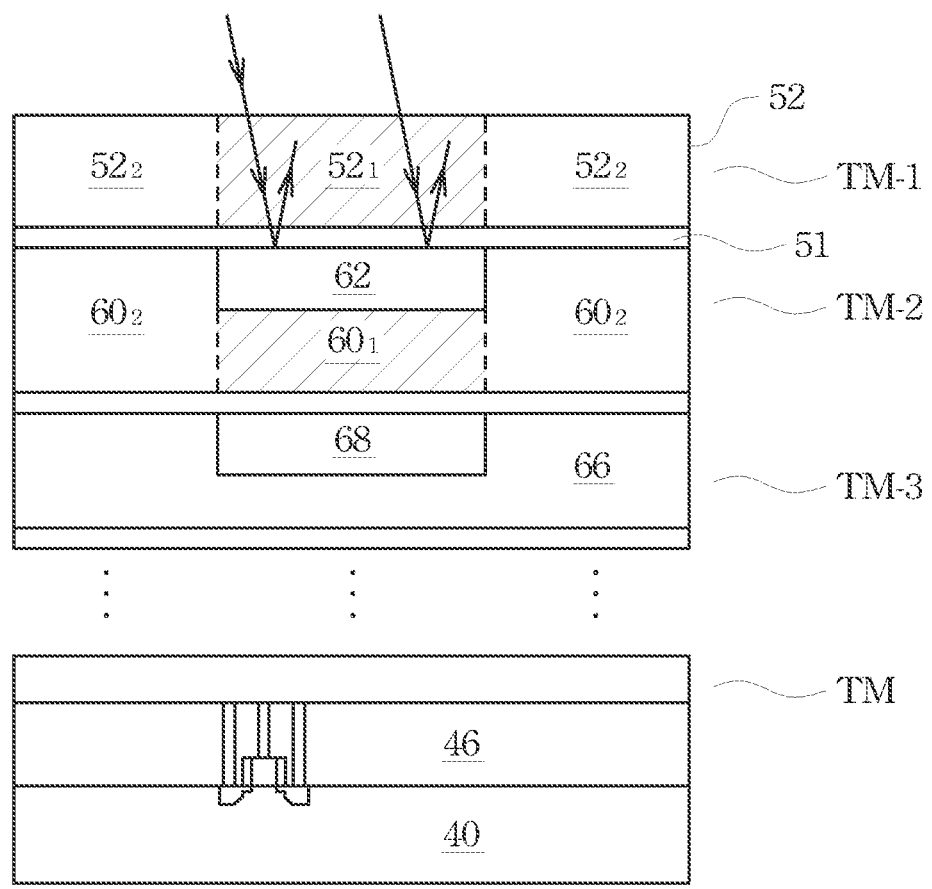

FIGS. 8 through 10 illustrate a brief process for forming the embodiment shown in FIG. 3. Referring to FIG. 8, the integrated circuit structure is formed up to metallization layer M-3. Metallization layer M-3 includes low-k dielectric layer 66 and reflective metal pad 68. Optionally, more reflective metal pads (not shown) may be formed underlying, and substantially aligned to metal pad 68. Metal pad 68 may be formed simultaneously with the metal lines (not shown) in low-k dielectric layer 66, which are used for connecting integrated circuit devices. The formation methods of metal pad 68 include well-known damascene processes.

Next, as shown in FIG. 9, etch stop layer 58 and low-k dielectric layer 60 are formed, followed by the UV curing of low-k dielectric layer 60. In an exemplary embodiment, the UV curing is performed using a UV light with a wavelength of between about 500 nm and about 150 nm. Reflective metal pad 68 reflects the UV light, and hence more UV energy can be absorbed by low-k dielectric layer 60. Accordingly, portion $60_1$ of low-k dielectric layer 60, which is directly over reflective metal pad 68, is cured more effectively, and hence its mechanical strength is improved. As a comparison, in portions $60_2$ with no reflective metal pad formed underneath, the UV light penetrates into dielectric layer 66, and hence the portions $60_2$ of low-k dielectric layer 60 have a lower mechanical strength than portion $60_1$.

Next, as shown in FIG. 10, reflective metal pad 62 is formed in low-k dielectric layer 60. Etch stop layer 51 and low-k dielectric layer 52 are then formed, followed by the UV curing of low-k dielectric layer 52. Similarly, the portion $52_1$ of low-k dielectric layer 52, which is directly over reflective metal pad 62, is cured more effectively, and hence portion $52_1$ has a greater mechanical strength than portions $52_2$, which have no reflective metal pads underneath. Next, referring back to FIG. 3, passivation layer 50 and bond pad 48 are formed over low-k dielectric layer 52. The process details are known in the art, and hence are not repeated herein.

By forming reflective metal pads underlying low-k dielectric layers, the mechanical strength of the portions of low-k dielectric layers directly over the reflective metal pads is improved. The embodiments of the present invention require no addition masks and process steps, and hence no extra manufacturing cost is incurred.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A structure comprising:
   a bond pad formed in a top dielectric layer over a substrate;
   a first metallization layer formed under the top dielectric layer;
   a first reflective metal pad formed in a second metallization layer, wherein the second metallization layer is formed under the first metallization layer, wherein the first reflective metal pad is vertically overlapped by the bond pad, and all bottom surfaces of the first reflective metal pad and all top surfaces of the first reflective metal pad are in contact with dielectric materials, and wherein the first reflective metal pad is electrically floating; and
   a second reflective metal pad formed in a third metallization layer, wherein the third metallization layer is formed under the second metallization layer, and wherein the second reflective metal pad is vertically overlapped by the bond pad.

2. The structure of claim 1, wherein:

the first reflective metal pad is of a size greater than a size of the bond pad.

3. The structure of claim 1, wherein:
the first reflective metal pad is of a first length and a first width; and
the bond pad is of a second length and a second width, and wherein the first length is greater than the second length and the first width is greater than the second width.

4. The structure of claim 1, wherein:
the second reflective metal pad is of a size greater than the size of the bond pad.

5. The structure of claim 3, wherein:
the second reflective metal pad is of a third length and a third width, and wherein the third length is greater than the second length and the third width is greater than the second width.

6. The structure of claim 1, wherein:
the second reflective metal pad is electrically floating.

7. The structure of claim 1, further comprising:
a reflective metal structure comprising the first reflective metal pad, the second reflective metal pad and a via coupled between the first reflective metal pad and the second reflective metal pad.

8. The structure of claim 7, wherein:
the reflective metal structure is electrically floating.

9. A device comprising:
a plurality of integrated circuits formed in a substrate;
a plurality of inter metal dielectric layers formed over the substrate, wherein a bond pad is formed in a top inter metal dielectric layer; and
a first reflective metal pad formed underneath the bond pad, wherein:
the first reflective metal pad is vertically aligned with the bond pad; and
the first reflective metal pad is completely enclosed by a low-k dielectric layer in the plurality of inter metal dielectric layers and an etch stop layer, wherein the first reflective metal pad is electrically floating, and wherein the first reflective metal pad has a length and a width greater than a length and a width, respectively, of the bond pad.

10. The device of claim 9, further comprising a second reflective metal pad formed underneath the first reflective metal pad, wherein:
the second reflective metal pad is vertically aligned with the bonding pad; and
the second reflective metal pad has a first horizontal dimension greater than about 80 percent a second horizontal dimension of the bond pad, with the first horizontal dimension and the second horizontal dimension measured in a same direction.

11. The device of claim 10, further comprising:
a reflective metal pad interconnect via coupled between the first reflective metal pad and the second reflective metal pad.

12. The device of claim 11, wherein:
the reflective metal pad interconnect via is electrically floating.

13. The device of claim 9, further comprising:
a first dielectric layer formed between the bond pad and the first reflective metal pad.

14. The device of claim 13, further comprising:
an etch stop layer formed between the first dielectric layer and the top inter metal dielectric layer.

15. The device of claim 13, wherein the first dielectric layer comprises:
a first portion vertically located at a left side of the first reflective metal pad;
a second portion vertically located at a right side of the first reflective metal pad; and
a third portion on top of the first reflective metal pad.

16. The device of claim 15, wherein:
the first portion and the second portion are of a first mechanical strength; and
the third portion is of a second mechanical strength greater than the first mechanical strength, wherein the first portion, the second portion, and the third portion are formed of a same material.

17. A device comprising:
a substrate comprising a plurality of integrated circuits;
a first dielectric layer formed over the substrate;
a second dielectric layer over the first dielectric layer;
a first reflective metal pad in the first dielectric layer, wherein a top surface of the first reflective metal pad is coplanar with a top surface of the first dielectric layer, and wherein all top surfaces and all bottom surfaces of the first reflective metal pad are in contact with dielectric materials, and wherein the first dielectric layer comprises:
a first portion;
a second portion; and
a third portion over a top of the first reflective metal pad, with the first portion and the second portion being on opposite sides of the third portion, wherein the first portion, the second portion, and the third portion are formed of a same material, and have top surfaces coplanar with each other, and bottom surfaces coplanar with each other, and wherein the first portion and the second portion have a first mechanical strength, and the third portion has a second mechanical strength greater than the first mechanical strength;
a second reflective metal pad in the second dielectric layer, wherein a top surface of the second reflective metal pad is coplanar with a top surface of the second dielectric layer, wherein the second reflective metal pad and the first reflective metal pad are separated by the second dielectric layer; and
a bond pad over the first dielectric layer, wherein the bond pad is vertically aligned with the first reflective metal pad.

18. The device of claim 17, wherein:
the second reflective metal pad is vertically aligned with the bond pad.

19. The device of claim 17, wherein the first reflective metal pad and the second reflective metal pad are electrically disconnected from each other.

20. The structure of claim 1, wherein no via interconnects the first reflective metal pad and the second reflective metal pad.

21. The structure of claim 1, wherein the first reflective metal pad is completely enclosed by dielectric materials.

22. The device of claim 17, wherein the first reflective metal pad is completely enclosed by dielectric materials.

* * * * *